United States Patent
Jin et al.

(10) Patent No.: US 10,446,780 B1
(45) Date of Patent: Oct. 15, 2019

(54) ORGANIC LIGHT EMITTING DIODE PACKAGE STRUCTURE AND ITS METHOD OF MANUFACTURING, DISPLAY DEVICE

(71) Applicant: Wuhan China Star Optoelectronics Semiconductor Display Technology Co., Ltd., Wuhan, Hubei (CN)

(72) Inventors: Jiangjiang Jin, Guangdong (CN); Hsiang-lun Hsu, Guangdong (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/108,174

(22) Filed: Aug. 22, 2018

Related U.S. Application Data

(63) Continuation of application No. PCT/CN2018/087743, filed on May 22, 2018.

(30) Foreign Application Priority Data

Apr. 19, 2018 (CN) .......................... 2018 1 0354237

(51) Int. Cl.
- *H01L 51/50* (2006.01)
- *H01L 51/56* (2006.01)
- *H01L 51/00* (2006.01)

(52) U.S. Cl.
CPC ...... *H01L 51/5012* (2013.01); *H01L 51/0034* (2013.01); *H01L 51/0097* (2013.01); *H01L 51/56* (2013.01)

(58) Field of Classification Search
CPC .......................... H01L 51/5012; H01L 51/56
USPC .......................................................... 257/40
See application file for complete search history.

(56) References Cited

U.S. PATENT DOCUMENTS

| | | | |
|---|---|---|---|
| 2011/0097533 A1 | 4/2011 | Li et al. | |
| 2016/0155629 A1* | 6/2016 | Hawryluk | H01L 21/268 438/509 |
| 2018/0155572 A1* | 6/2018 | Lee | C09D 163/00 |
| 2018/0315956 A1 | 11/2018 | Jin et al. | |
| 2019/0010340 A1* | 1/2019 | Yoon | G02B 1/18 |
| 2019/0058163 A1* | 2/2019 | Wang | H01L 51/5262 |

FOREIGN PATENT DOCUMENTS

| CN | 103928634 A | 7/2014 |
|---|---|---|
| CN | 103956363 A | 7/2014 |
| CN | 107302014 A | 10/2017 |
| CN | 107785503 A | 3/2018 |

* cited by examiner

*Primary Examiner* — Igwe U Anya

(57) ABSTRACT

The present disclosure discloses an organic light emitting diode package structure and its method of manufacturing, and a display device. The method of manufacturing includes: preparing an inorganic substrate comprising a hydroxyl group; preparing a first atomic transition layer on the inorganic substrate; coating a first organic layer on the first atomic transition layer, the first organic layer is formed by mixing two epoxy resin monomers; and curing the first organic layer so that the first organic layer is chemically bonded to the inorganic substrate through the first atomic transition layer. In the above manner, the present disclosure can increase the adhesion between the organic layer and the inorganic layer and prevent the display device from package failure caused by peeling between the package layers during bending or folding.

15 Claims, 4 Drawing Sheets

ORGANIC LIGHT EMITTING DIODE PACKAGE STRUCTURE AND ITS METHOD OF MANUFACTURING, DISPLAY DEVICE

CROSS-REFERENCE TO RELATED APPLICATIONS

This is a continuation-application of International Application NO. PCT/CN2018/087743, with an international filing date of May 22, 2018, which claims foreign priority of Chinese Patent Application No. 201810354237.8, filed on Apr. 19, 2018 in the State Intellectual Property Office of China, the contents of all of which are hereby incorporated by reference.

TECHNICAL FIELD

The present disclosure relates to display technologies, and in particular to an organic light emitting diode (OLED) package structure and its method of manufacturing, and a display device.

BACKGROUND

OLED, as a new generation display technology, has attracted wide attention because they can be made thinner and can realize flexible display. One of the important factors restricting the flexible display at present is the package technology. The OLED uses small molecules or macromolecules to apply voltage through anode and cathode to form electroluminescence. These luminescent materials are easily cleavable in the presence of water or oxygen, thus affecting the lifetime of OLED. Therefore, higher demands are imposed on OLED packaging.

Thin film package technology is currently the most widely used package technology for flexible displays. It generally adopts an inorganic/organic alternating structure. This organic and inorganic package structure can not only meet the purpose of blocking external water and oxygen, but also can achieve the bend requirement of the flexible display. However, in the multiple bending process, the interfaces between the organic and inorganic layers are easily separated, so that the package structure cannot block external water and oxygen.

SUMMARY

The present disclosure provides an organic light emitting diode package structure and its method of manufacturing, and a display device, which can increase the adhesion between the organic layer and the inorganic layer so as to prevent the display device from package failure caused by peeling between the package layers during bending or folding, thereby ensuring the reliability of the flexible display device.

In order to solve the technical problem mentioned above, one technical solution adopted by the present disclosure is: providing a display device, including an organic light emitting diode and a package structure, wherein the package structure includes: an inorganic substrate; a first atomic transition layer formed on the inorganic substrate; a first organic layer formed on the first atomic transition layer; the first organic layer is an organic layer formed by mixing two epoxy resin monomers, the first organic layer is chemically bonded to the inorganic substrate through the first atomic transition layer; a first inorganic layer formed on the first organic layer; wherein, a thickness of the first organic layer is in a range of 2-20 µm, and a thickness of the first inorganic layer is in a range of 10 nm-1 µm.

In order to solve the technical problem mentioned above, another technical solution adopted by the present disclosure is: providing a method of manufacturing an organic light emitting diode package structure, the method of manufacturing includes: preparing an inorganic substrate comprising a hydroxyl group; preparing a first atomic transition layer on the inorganic substrate, the first atomic transition layer is formed by a reaction of a trimethylaluminum oxide and a hydroxyl group; coating a first organic layer on the first atomic transition layer, the first organic layer is formed by mixing two epoxy resin monomers, at least one of the two epoxy resin monomers includes a carboxyl group; curing the first organic layer so that the first organic layer is chemically bonded to the inorganic substrate through the first atomic transition layer; forming a first inorganic layer on the first organic layer.

In order to solve the technical problem mentioned above, another technical solution adopted by the present disclosure is: providing an organic light emitting diode package structure including an inorganic substrate; a first atomic transition layer formed on the inorganic substrate; a first organic layer formed on the first atomic transition layer; the first organic layer is an organic layer formed by mixing two epoxy resin monomers, the first organic layer is chemically bonded to the inorganic substrate through the first atomic transition layer; a first inorganic layer formed on the first organic layer.

The benefit effects of the present disclosure are: providing an organic light emitting diode package structure and its method of manufacturing, and a display device, by forming an atomic transition layer with an atomic level thickness between the inorganic layer and the organic layer of the organic light emitting diode package structure, and connecting the atomic transition layer, the inorganic layer and the organic layer by a chemical bond, the present disclosure can increase the adhesion between the organic layer and the inorganic layer so as to prevent the display device from package failure caused by peeling between the package layers during bending or folding, thereby ensuring the reliability of the flexible display device.

DETAILED DESCRIPTION

Figure 1:
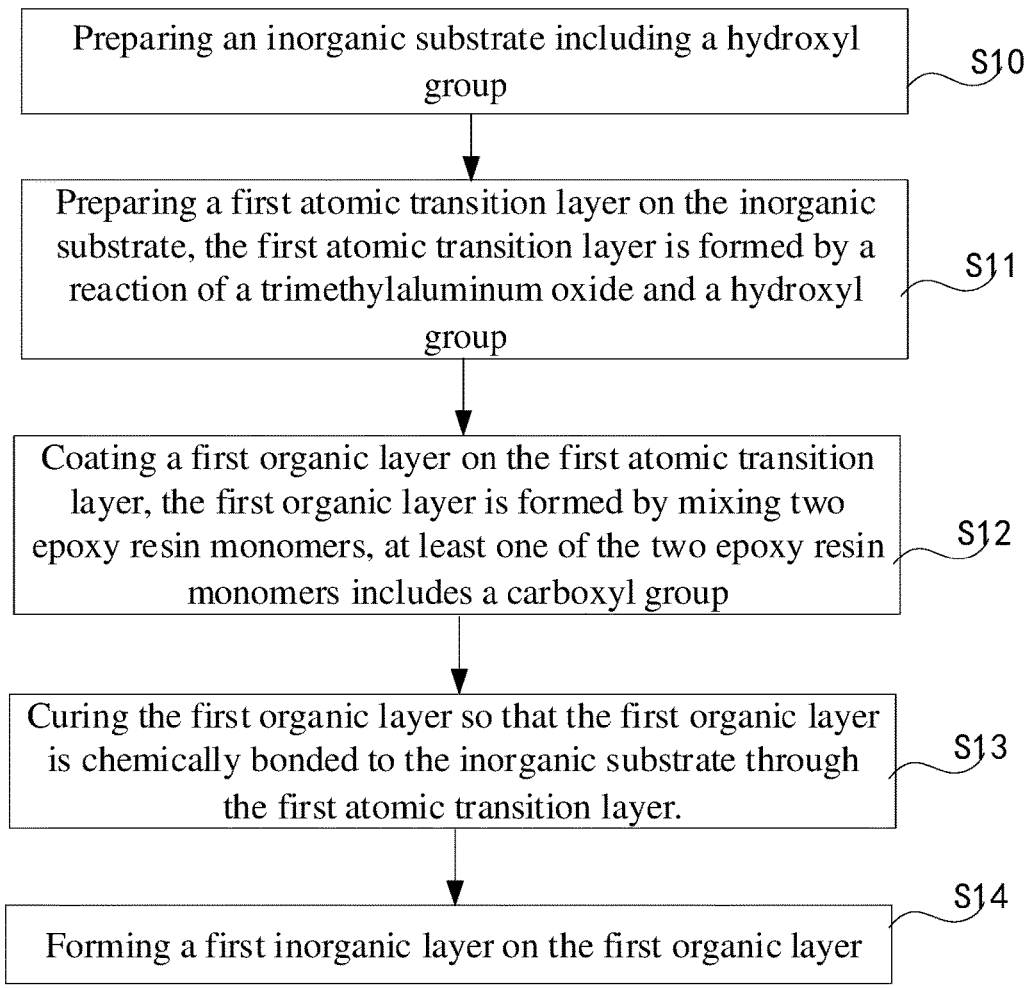
FIG. 1 is a schematic flowchart of a first embodiment of a method of manufacturing an organic light emitting diode package structure provided by the present disclosure.

The following will clearly and completely describe the technical solutions in the embodiments of the present disclosure with reference to the accompanying drawings in the embodiments of the present disclosure. It is to be understood that the specific embodiments described herein are only used to explain the present disclosure and are not intended to limit the present disclosure. It should also be noted that for ease of description, only some but not all of the structures related to the present disclosure are shown in the drawings. All other embodiments obtained by a person of ordinary skill in the art based on the embodiments of the present disclosure without making creative efforts shall fall within the protection scope of the present disclosure.

Please referring to FIG. 1, FIG. 1 is a schematic flowchart of a first embodiment of a method of manufacturing an organic light emitting diode package structure provided by the present disclosure. As shown in FIG. 1, the specific preparation of the organic light emitting diode package structure in this disclosure includes the following blocks:

Block S10, preparing an inorganic substrate including a hydroxyl group.

Figure 2:
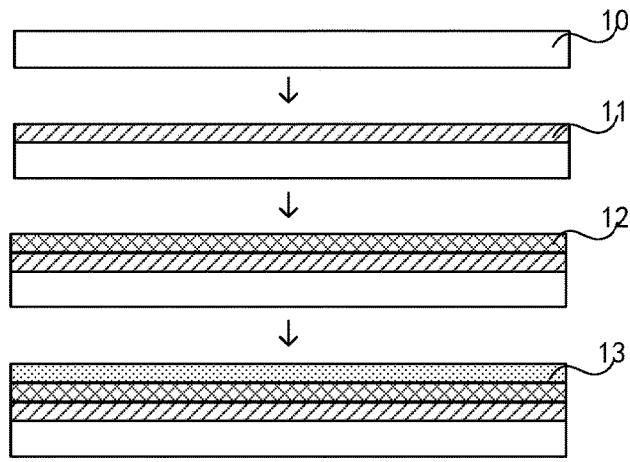
FIG. 2 is a schematic flowchart of a first embodiment of a manufacturing process of an organic light emitting diode package structure provided by the present disclosure.
Figure 3:
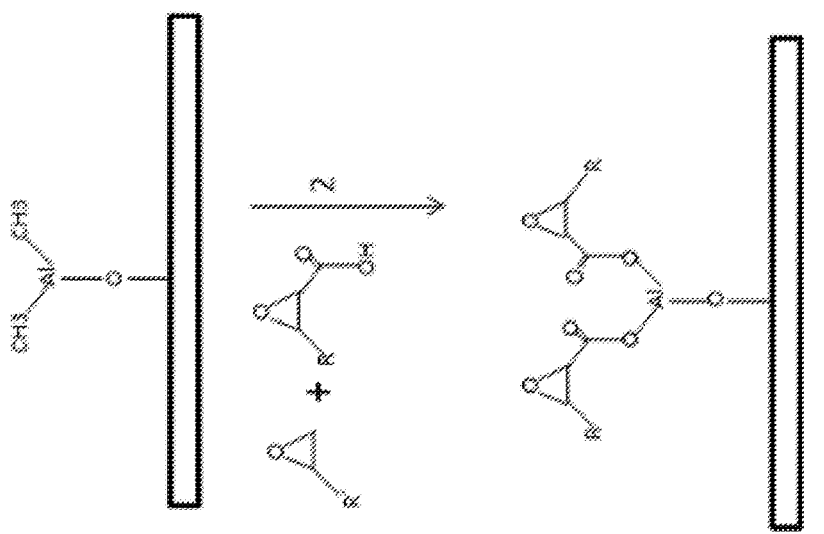
FIG. 3 is a schematic flowchart of a second embodiment of a manufacturing process of an organic light emitting diode package structure provided by the present disclosure.
Figure 3:
Figure 3:
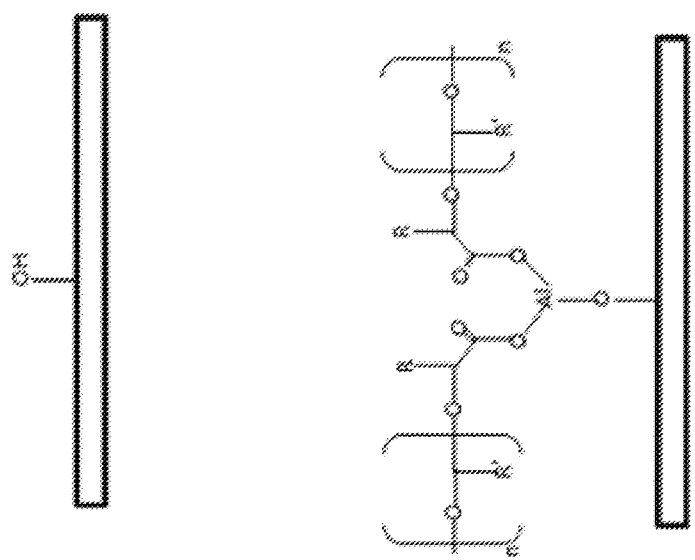

Please referring to FIG. 2 and FIG. 3, FIG. 2 is a schematic flowchart of a first embodiment of a manufacturing process of an organic light emitting diode package structure provided by the present disclosure, and FIG. 3 is a schematic flowchart of a second embodiment of manufacturing process of an organic light emitting diode package structure provided by the present disclosure. As shown in FIG. 2, providing an inorganic substrate 10 firstly, and the material of the inorganic substrate 10 may be one of a metal, a non-metallic nitride, an oxide, or an oxynitride. Specifically, the material of the inorganic substrate 10 may be one of silicon nitride ($SiN_x$), silicon oxide ($SiO_2$), aluminum oxide ($Al_2O_3$), and zirconium oxide ($ZrO_2$). The thickness of the inorganic substrate 10 may be in the range of 10-1000 nm, and specifically may be 10 nm, 500 nm, 1000 nm, etc., which is not further defined here.

Further, the surface of the inorganic substrate 10 is subjected to hydroxylation treatment using oxygen or ozone ($O_3$) so that the surface of the inorganic substrate 10 is rich in hydroxyl group (—OH).

Block S11: Preparing a first atomic transition layer on the inorganic substrate, the first atomic transition layer is formed by a reaction of a trimethylaluminum oxide and a hydroxyl group.

Referring to FIG. 2 and FIG. 3, a first atomic transition layer 11 is prepared on the above described inorganic substrate 10, the surface of which is rich in hydroxyl groups. In a specific embodiment, trimethylaluminum oxide is deposited on the inorganic substrate 10 using an atomic layer deposition (ALD) apparatus so that the trimethylaluminum oxide reacts with the hydroxyl group on the inorganic substrate 10 to form a thin, highly active first atomic transition layer 11.

In this embodiment, the molar mass of the trimethylaluminum oxide introduced by the ALD apparatus is much greater than the molar mass of the hydroxyl group so that all the hydroxyl groups on the inorganic substrate 10 are completely reacted. After the hydroxyl groups on the inorganic substrate 10 are completely reacted, unreacted trimethylaluminum oxide and methane generated by the reaction are removed.

Block S12, coating a first organic layer on the first atomic transition layer, the first organic layer is formed by mixing two epoxy resin monomers, at least one of the two epoxy resin monomers includes a carboxyl group.

In the block S12, the first organic layer formed by mixing two epoxy resin monomers is coated on the first atomic transition layer 11 by ink jet printing (Ink Jet Printing, IJP) or slot coating process. At least one epoxy resin monomer in the two epoxy resin monomers includes a carboxyl group (—COOH). Of course, in other embodiments, both the tow epoxy resin monomers may include a carboxyl group, and is not further limited here.

Specifically, the mass ratio of the two epoxy resin monomers may be 1:1. In the preparation process, the hydroxyl group (—OH) on the carboxyl-containing epoxy resin monomer undergoes a redox reaction with the methyl group (—CH3) on the first atomic transition layer 11, so that the first organic layer 12 consisting of epoxy monomers and the inorganic substrate 11 are chemically bonded by aluminum atoms (Al). In this embodiment, the thickness of the first organic layer 12 is in the range of 2-20 μm, and may specifically be 2 μm, 11 μm, 20 μm, etc., which is not further defined herein.

Block S13: curing the first organic layer so that the first organic layer is chemically bonded to the inorganic substrate through the first atomic transition layer.

By using UV curing, the two epoxy resin monomers in the first organic layer 12 are polymerized to form a polymer organic layer, and the first organic layer is chemically bonded with the inorganic substrate 10 by the first atomic transition layer and there is a good adhesion.

In this embodiment, an atomic transition layer with an atomic level thickness is formed between the inorganic layer and the organic layer of the organic light emitting diode package structure, and the atomic transition layer, the inorganic layer and the organic layer are connected by a chemical bond. Therefore, the present embodiment can increase the adhesion between the organic layer and the inorganic layer so as to prevent the display device from package failure caused by peeling between the package layers during bending or folding, thereby ensuring the reliability of the flexible display device.

Block S14, forming a first inorganic layer on the first organic layer.

Finally, a first inorganic layer 13 is deposited on the cured first organic layer 12. The material of the first inorganic layer 13 may be one of zirconium aluminate ($ZrAl_xO_y$), graphene, alumina ($Al_2O_3$), zirconium oxide ($ZrO_2$), zinc oxide ($ZnO_2$), silicon nitride ($SiN_x$), silicon oxide ($SiO_x$), silicon carbonitride (SiCN), titanium dioxide ($TiO_2$), and diamond-like carbon (DLC). Specifically, atom deposition, pulsed laser deposition, sputter deposition, and plasma enhanced chemical vapor deposition may be used. In the present embodiment, the thickness of the first inorganic layer 13 may be in the range of 10 nm-1 μm, and may specifically be 10 nm, 0.5 μm, 1 μm, etc., and is not further defined herein.

In the above embodiment, by forming an atomic transition layer with an atomic level thickness between the inorganic layer and the organic layer of the organic light emitting diode package structure, and connecting the atomic transition layer, the inorganic layer and the organic layer by a chemical bond, the present disclosure can increase the adhesion between the organic layer and the inorganic layer so as to prevent the display device from package failure caused by peeling between the package layers during bending or folding, thereby ensuring the reliability of the flexible display device.

Figure 4:
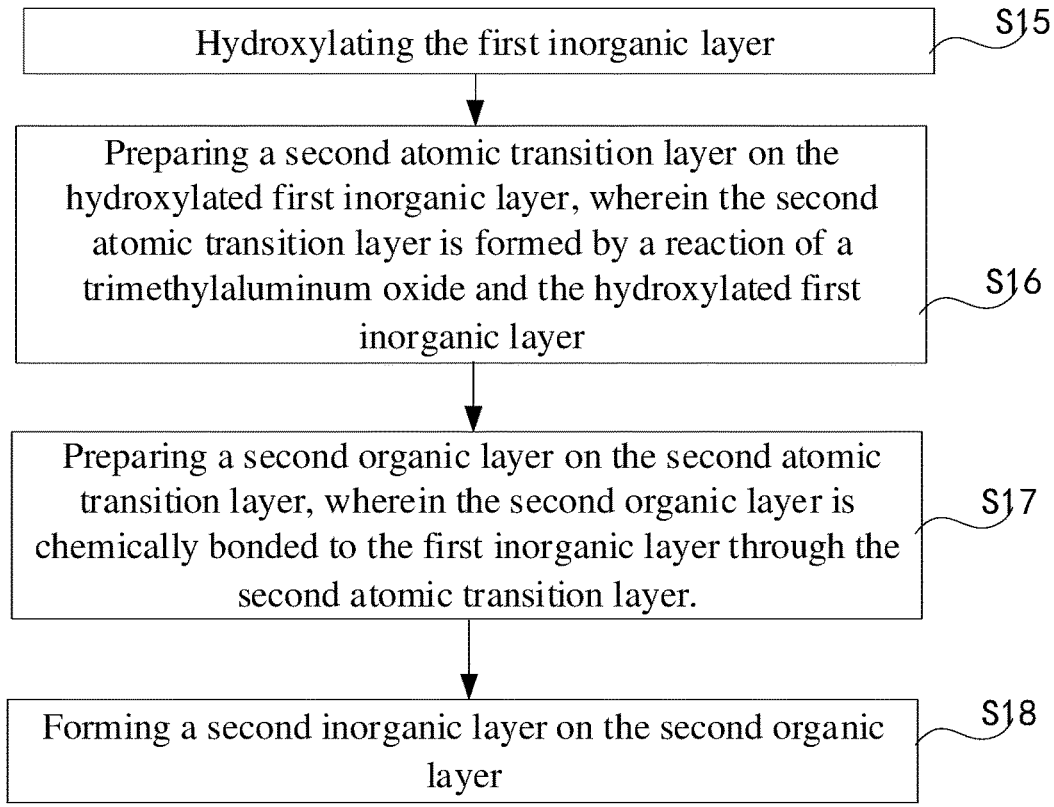
FIG. 4 is a schematic flowchart of a second embodiment of a method of manufacturing an organic light emitting diode package structure provided by the present disclosure.

Please referring to FIG. 4, FIG. 4 is a schematic flowchart of a second embodiment of a method of manufacturing an organic light emitting diode package structure provided by the present disclosure. The present embodiment is substantially the same as the first embodiment except that after the first inorganic layer is prepared in the present embodiment, a laminated structure needs to be further prepared on the first inorganic layer. Specific blocks are as follows:

Block S15, hydroxylating the first inorganic layer.

The surface of the first inorganic layer 13 is subjected to hydroxylation treatment using oxygen or ozone ($O_3$) so that the surface of the first inorganic layer 13 is rich in hydroxyl groups (—OH).

Block S16, preparing a second atomic transition layer on the hydroxylated first inorganic layer, wherein the second atomic transition layer is formed by a reaction of a trimethylaluminum oxide and the hydroxylated first inorganic layer.

Similar to the preparation of the first atomic transition layer in the first embodiment, that is, trimethylaluminum oxide is introduced through an ALD apparatus, and the molar mass of trimethylaluminum oxide is much larger than the molar mass of the hydroxyl group, so that all the hydroxyl groups on the first inorganic layer 13 are completely reacted to form a thin and highly active second atomic transition layer 14. After the hydroxyl groups on the first inorganic layer 13 are completely reacted, unreacted trimethylaluminum oxide and methane generated by the reaction are removed.

Block S17, preparing a second organic layer on the second atomic transition layer, wherein the second organic layer is chemically bonded to the first inorganic layer through the second atomic transition layer.

Similar to the preparation of the first inorganic layer 12 in the first embodiment. The second organic layer 15 in this embodiment uses an ink jet printing (IJP) or a slot coating process. On the second atomic transition layer 14, a second organic layer 15 formed by mixing two kinds of epoxy resin monomers is coated. At least one epoxy resin monomer in the two epoxy resin monomers includes a carboxyl group (—COOH). Of course, in other embodiments, both the two epoxy resin monomers may include a carboxyl group, and are not further limited here.

Specifically, the mass ratio of the two epoxy resin monomers may be 1:1. In the preparation process, the hydroxyl group (—OH) on the carboxyl-containing epoxy resin monomer undergoes a redox reaction with the methyl group (—CH3) on the second atomic transition layer 14, so that the second organic layer 15 consisting of epoxy monomers and the first inorganic layer 13 are chemically bonded by aluminum atoms (Al). In this embodiment, the thickness of the first inorganic layer 13 is in the range of 2-20 μm, and may specifically be 2 μm, 11 μm, 20 μm, etc., which is not further defined herein.

Further, by using UV curing, the two epoxy resin monomers in the second organic layer 15 are polymerized to form a polymer organic layer, and the second organic layer 15 is chemically bonded with the first inorganic layer 13 by the first atomic transition layer and there is a good adhesion.

Block S18, forming a second inorganic layer on the second organic layer.

Similar to the preparation of the first inorganic layer in the first embodiment, the material and the thickness of the second inorganic layer 16 in this embodiment are the same as those of the first inorganic layer, and the material may be one of zirconium aluminate ($ZrAl_xO_y$), graphene, alumina ($Al_2O_3$), zirconium oxide ($ZrO_2$), zinc oxide ($ZnO_2$), silicon nitride ($SiN_x$), silicon oxide ($SiO_x$), silicon carbonitride (SiCN), titanium dioxide ($TiO_2$), and diamond-like carbon (DLC). The thickness may be in the range of 10 nm-1 um, and specifically may be 10 nm, 0.5 μm, 1 μm, etc., and is not further defined herein.

In the above embodiment, the organic light-emitting diodes are packaged by a two-layer package structure, and an atomic transition layer is formed between the organic layer and the inorganic layer in each package structure, and the atomic transition layer connects the organic layer and the inorganic layer in a chemical bond manner. Therefore, the adhesion between the organic layer and the inorganic layer is enhanced so as to prevent the display device from package failure caused by peeling between the package layers during bending or folding, thereby ensuring the reliability of the flexible display device.

Figure 5:
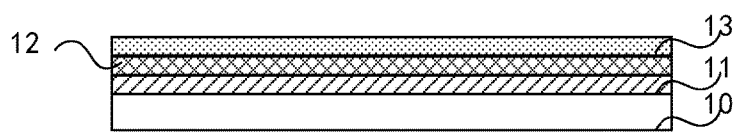
FIG. 5 is a schematic structural diagram of a first embodiment of a package structure provided by the present disclosure.

Please referring to FIG. 5, FIG. 5 is a schematic structural diagram of a first embodiment of a package structure provided by the present disclosure. As shown in the figure, the package structure in the present embodiment includes an inorganic substrate 10, a first atomic transition layer 11, a first organic layer 12, and a first inorganic layer 13.

Among them, the material of the inorganic substrate 10 may be one of a metal, a non-metallic nitride, an oxide, or an oxynitride. Specifically, it may be one of silicon nitride ($SiN_x$), silicon oxide ($SiO_2$), aluminum oxide ($Al_2O_3$), and zirconium oxide ($ZrO_2$). The thickness of the inorganic substrate 10 may be in a range of 10-1000 nm, and specifically may be 10 nm, 500 nm, 1000 nm, etc., which is not further defined herein.

The first atomic transition layer 11 is formed on the inorganic substrate 10.

The first organic layer 12 is formed on the first atomic transition layer 10, and the first organic layer 12 is an organic layer formed by mixing two epoxy resin monomers, and in this embodiment, the first organic layer 12 is chemically bonded to the inorganic substrate 10 through the atomic transition layer 11. The thickness of the first organic layer 12 may be in a range of 2-20 μm, and may specifically be 2 μm, 11 μm, 20 μm, etc., which is not further defined herein.

The first inorganic layer 13 is formed on the first organic layer 12. The material of the first inorganic layer 13 may be one of zirconium aluminate ($ZrAl_xO_y$), graphene, alumina ($Al_2O_3$), zirconium oxide ($ZrO_2$), zinc oxide ($ZnO_2$), silicon nitride ($SiN_x$), silicon oxide ($SiO_x$), silicon carbonitride (SiCN), titanium dioxide ($TiO_2$), and diamond-like carbon (DLC). The thickness of the first inorganic layer 13 may be in a range of 10 nm-1 μm, and specifically may be 10 nm, 0.5 μm, 1 μm, or the like.

A description of the encapsulation structure in this disclosure can be referred to the specific description in the above first embodiment, and details are not described herein again.

Figure 6:
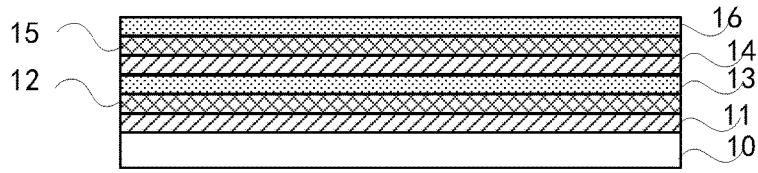
FIG. 6 is a schematic structural diagram of a second embodiment of a package structure provide by the present disclosure.

Please referring to FIG. 6, FIG. 6 is a schematic structural diagram of a second embodiment of a package structure provide by the present disclosure. The package structure in this embodiment is further developed on the basis of that in the first embodiment, and the similarities are not repeated here. The specific structure is described as follows:

The package structure further includes a second atomic transition layer 14, a second organic layer 15, and a second inorganic layer 16.

The second atomic transition layer 14 is formed on the first inorganic layer 13.

The second organic layer 15 is formed on the second atomic transition layer 14, and the second organic layer 15 is chemically bonded to the first inorganic layer 13 through the second atomic transition layer 14. The thickness of the second organic layer 15 is in the range of 2-20 μm, and may specifically be 2 μm, 11 μm, 20 μm, and the like.

The second inorganic layer 16 is formed on the second organic layer 15. The thickness of the second inorganic layer is in the range of 10 nm-1 µm, and specifically, it may be 10 nm, 0.5 µm, 1 µm, or the like.

The details of the materials or thicknesses of the inorganic layers or the organic layers used in this embodiment can be referred to the specific description of the second embodiment of the above-described manufacturing method, and details are not described herein again.

In the above embodiment, the organic light-emitting diodes are packaged by a two-layer package structure, and an atomic transition layer is formed between the organic layer and the inorganic layer in each package structure, and the atomic transition layer connects the organic layer and the inorganic layer in a chemical bond manner. Therefore, the adhesion between the organic layer and the inorganic layer is enhanced so as to prevent the display device from package failure caused by peeling between the package layers during bending or folding, thereby ensuring the reliability of the flexible display device.

Figure 7:
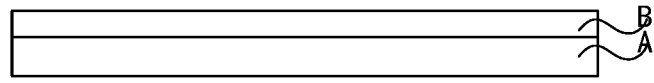
FIG. 7 is a schematic structural diagram of an embodiment of a display device provided by the present disclosure.

Please referring to FIG. 7, FIG. 7 is a schematic structural diagram of an embodiment of a display device provided by the present disclosure. The display device in the present disclosure includes an organic light emitting diode A and any one of the above package structures B, and the description of the specific structure of the package structure B can be referred to the specific description in the above embodiment and will not be described herein again.

In summary, the person skilled in the art can easily understand that the present disclosure provides an organic light emitting diode package structure and a display device. By forming an atomic transition layer with an atomic level thickness between the inorganic layer and the organic layer of the organic light emitting diode package structure, and connecting the atomic transition layer, the inorganic layer and the organic layer by a chemical bond, the present disclosure can increase the adhesion between the organic layer and the inorganic layer so as to prevent the display device from package failure caused by peeling between the package layers during bending or folding, thereby ensuring the reliability of the flexible display device.

The foregoing descriptions are merely implementation manners of the present disclosure, and therefore do not limit the scope of patents of the present disclosure. Any equivalent structure or equivalent process transformation using the description of the present disclosure and the accompanying drawings may be directly or indirectly applied to other related technologies. The same applies in the field of patent protection of this disclosure.

What is claimed is:

1. A display device, comprising an organic light emitting diode and a package structure, wherein the package structure comprises:
   an inorganic substrate;
   a first atomic transition layer formed on the inorganic substrate;
   a first organic layer formed on the first atomic transition layer; the first organic layer is an organic layer formed by mixing two epoxy resin monomers, and the first organic layer is chemically bonded to the inorganic substrate through the first atomic transition layer; and
   a first inorganic layer formed on the first organic layer;
   wherein, a thickness of the first organic layer is in a range of 2-20 µm, and a thickness of the first inorganic layer is in a range of 10 nm-1 µm.

2. The display device according to claim 1, wherein the package structure further comprises:
   a second atomic transition layer formed on the first inorganic layer;
   a second organic layer formed on the second atomic transition layer, the second organic layer is chemically bonded to the first inorganic layer through the second atomic transition layer; and
   a second inorganic layer formed on the second organic layer.

3. A method of manufacturing an organic light emitting diode package structure, wherein the method of manufacturing comprises:
   preparing an inorganic substrate comprising a hydroxyl group;
   preparing a first atomic transition layer on the inorganic substrate, the first atomic transition layer is formed by a reaction of a trimethylaluminum oxide and a hydroxyl group;
   coating a first organic layer on the first atomic transition layer, the first organic layer is formed by mixing two epoxy resin monomers, at least one of the two epoxy resin monomers comprises a carboxyl group;
   curing the first organic layer so that the first organic layer is chemically bonded to the inorganic substrate through the first atomic transition layer; and
   forming a first inorganic layer on the first organic layer.

4. The method of manufacturing according to claim 3, wherein a mass ratio of the two epoxy resin monomers is 1:1.

5. The method of manufacturing according to claim 3, wherein a thickness of the first organic layer is in a range of 2-20 µm.

6. The method of manufacturing according to claim 3, wherein a thickness of the first inorganic layer is in a range of 10 nm-1 µm.

7. The method of manufacturing according to claim 3, wherein the method of manufacturing further comprises:
   hydroxylating the first inorganic layer;
   preparing a second atomic transition layer on the hydroxylated first inorganic layer, wherein the second atomic transition layer is formed by a reaction of a trimethylaluminum oxide and the hydroxylated first inorganic layer;
   preparing a second organic layer on the second atomic transition layer, wherein the second organic layer is chemically bonded to the first inorganic layer through the second atomic transition layer; and
   forming a second inorganic layer on the second organic layer.

8. The method of manufacturing according to claim 7, wherein the hydroxylating the first inorganic layer comprises:
   hydroxylating the first inorganic layer by oxygen or ozone.

9. An organic light emitting diode package structure, wherein the package structure comprises:
   an inorganic substrate;
   a first atomic transition layer formed on the inorganic substrate;
   a first organic layer formed on the first atomic transition layer; the first organic layer is an organic layer formed by mixing two epoxy resin monomers, and the first organic layer is chemically bonded to the inorganic substrate through the first atomic transition layer; and
   a first inorganic layer formed on the first organic layer.

10. The package structure according to claim 9, wherein the package structure further comprises:
    a second atomic transition layer formed on the first inorganic layer;

a second organic layer formed on the second atomic transition layer, the second organic layer is chemically bonded to the first inorganic layer through the second atomic transition layer; and a second inorganic layer formed on the second organic layer.

11. The package structure according to claim 10, wherein each of a thickness of the first organic layer and a thickness of the second organic layer is in a range of 2-20 μm.

12. The package structure according to claim 10, wherein each of a thickness of the first inorganic layer and a thickness of the second inorganic layer is in a range of 10 nm-1 μm.

13. The package structure according to claim 10, wherein a mass ratio of the two epoxy resin monomers is 1:1.

14. The package structure according to claim 10, wherein each of a material of the first organic layer and a material of the second organic layer is one of zirconium aluminate, graphene, alumina, zirconium oxide, zinc oxide, silicon nitride, silicon oxide, silicon carbonitride, titanium dioxide, and diamond-like carbon.

15. The package structure according to claim 9, wherein a material of the inorganic substrate is one of a metal, a non-metallic nitride, an oxide, or an oxynitride.

* * * * *